United States Patent [19]

Shimase et al.

[11] Patent Number: 5,439,763

[45] Date of Patent: * Aug. 8, 1995

[54] OPTICAL MASK AND METHOD OF CORRECTING THE SAME

[75] Inventors: Akira Shimase; Junzou Azuma, both of Yokohama; Satoshi Haraichi, Tsukuba; Fumikazu Itoh, Fujisawa; Yasuhiro Koizumi, Sayama, all of Japan

[73] Assignee: Hitachi, Ltd., Tokyo, Japan

[*] Notice: The portion of the term of this patent subsequent to Oct. 25, 2011 has been disclaimed.

[21] Appl. No.: 22,909

[22] Filed: Feb. 26, 1993

Related U.S. Application Data

[63] Continuation-in-part of Ser. No. 854,861, Mar. 19, 1992, Pat. No. 5,358,806.

[30] Foreign Application Priority Data

Feb. 28, 1992 [JP] Japan .................. 4-042814

[51] Int. Cl.[6] ............................... G03F 9/00
[52] U.S. Cl. ..................... 430/5; 250/492.2
[58] Field of Search .............. 430/5; 250/492.2; 156/625, 643

[56] References Cited

U.S. PATENT DOCUMENTS

| | | | |
|---|---|---|---|
| 4,367,119 | 1/1983 | Logan et al. | 430/313 |
| 4,503,329 | 5/1985 | Yamaguchi et al. | 250/309 |
| 5,045,417 | 9/1991 | Okamoto | 430/5 |
| 5,358,806 | 10/1994 | Haraichi et al. | 430/5 |

FOREIGN PATENT DOCUMENTS 58-56332  4/1983  Japan .
3-196041  8/1991  Japan .
4-449     1/1992  Japan .

OTHER PUBLICATIONS

*Journal of the Institute of Applied Physics,* vol. 60, No. 11, (1991), pp. 1076–1086, "High Resolution Light Lithography Technology Using Phase Shift Method".

*Primary Examiner*—Mark A. Chapman
*Attorney, Agent, or Firm*—Antonelli, Terry, Stout & Kraus

[57] ABSTRACT

An optical mask for a projection optical system and a method of correcting the mask wherein the mask includes a light intercepting pattern formed on a transparent substrate and a phase shifter for changing the phase of an exposure light provided at predetermined openings of the light intercepting pattern. An etching stopper film which transmits the exposure light is provided between said phase shifter and said light intercepting pattern and for correction of the mask a focused ion beam is utilized for removal of defects by the phase shifter.

24 Claims, 7 Drawing Sheets

OPTICAL MASK AND METHOD OF CORRECTING THE SAME

CROSS-REFERENCE TO RELATED APPLICATION

This application is a continuation-in-part application of copending U.S. application Ser. No. 854,861 filed Mar. 19, 1992, now U.S. Pat. No. 5,358,806, entitled PHASE SHIFT MASK, METHOD OF CORRECTING THE SAME AND APPARATUS FOR CARRYING OUT THE METHOD by some of the inventors herein, the subject matter of which is incorporated by reference herein.

BACKGROUND OF THE INVENTION

The present invention relates to an optical mask for manufacturing a semiconductor, and more specifically, to a phase shift mask including a phase shifter formed on a transparent film in a predetermined pattern and a method for correcting defects thereof.

In a conventional photomask, a light intercepting pattern 2 of chromium or the like is formed on a transparent substrate 1 such as quartz. However, as a semiconductor pattern has been miniaturized, the improvement of a pattern resolution in a lithography process has been demanded, and thus a phase shift mask having such a basic structure as shown in FIG. 1 has been put into practical use, wherein a transparent pattern 4 for providing a phase difference to an exposure light is formed at specified gaps between two adjacent light intercepting pattern portions.

When a mask has defects, the defects are transferred to all of the semiconductor chips exposed with the mask, and accordingly the mask defects must be perfectly removed. The defects of a phase shift mask to be removed include not only the conventional omission of light intercepting portions and occurrence of excessive light intercepting portions, but also the omission of shifter portions and occurrence of unnecessary shifter portions. Among these defects, those other than the omission of the shifter portions can be corrected by local sputter etching using a focused ion beam and by film formation using a local chemical vapor reaction. However, for correction of the omission of the shifter portions, it is necessary to employ a method of providing a sub-shifter under a usual shifter or the like, as described in the article "High Resolution Light Lithography Technology Using Phase Shift Method" Journal of the Institute of Applied Physics, Vol. 60, No. 11 (1991), pgs. 1076-1086. Further, it is anticipated that a method of using a focused ion beam will be successful for the correction of fine local portions. This method has been applied to correct the defects of a conventional optical mask. Japanese Patent Application Laid-open No. 58-56332 describes a basic concept regarding the correction of the defects of the optical mask. Further, Japanese Patent Application Laid-open No. 3-196041 describes a defect correcting method for an optical mask wherein defect portions are etched to a certain depth such that phases of light passing through both the etched portion and the normal phase shift portion are the same so that a non-defect optical mask can be obtained.

The correction method reported by the aforementioned article is carried out by the following procedure. The structure of a phase shift mask is such that a silicon nitride film having a film thickness capable of inverting the phase of an exposure light by 180° is formed on a quartz substrate 1 as a sub-shifter 12 as shown in FIG. 2(a). A light intercepting pattern 2 of chromium is formed on the silicon nitride film 12. Then, a shifter pattern 4 of silicon oxide for inverting a phase by 180° is formed at specified gaps of the light intercepting pattern 2. The shifter 4 has defects such as a shifter omission portion 5 and a shifter remaining portion 6 formed in the process of forming the shifter 4. In the method for correcting these defects, first, a resist 13 is coated on the whole surface of the mask. The defective portions 5, 6 are then subjected to spot-exposure, and developed to form a resist pattern as shown in FIG. 2(b). This resist pattern is subjected to an anisotropic dry etching to remove the shifter 4 of silicon oxide, as shown in FIG. 2(c). In this dry etching, an etching gas capable of obtaining selective etching between silicon oxide and silicon nitride is used for stopping the etching on the surface of the sub-shifter 12. Conversely, using an etching gas having such a selection ratio that the processing speed of silicon nitride is greater than that of silicon oxide, an anisotropic dry etching is performed at the shifter omission portion 5, thereby removing the sub-shifter 12 formed on the underlayer by the silicon nitride. At this time, the etching stops on the upper surface of the substrate 1 because the substrate 1 under the silicon nitride is composed of quartz, i.e., silicon oxide. After the completion of the above processes, the resist 13 is removed, to thus obtain the corrected state as shown in FIG. 2(d). Before the correction of the defects, the phase of the exposure light transmitting through the shifter 4 becomes an intermediate value between 0° and 180° at the defective portions 5 and 6, and consequently, shading is formed upon exposure. However, by the removal of the shifter remaining portion 6 from the sub-shifter 12, the shading due to this portion 6 disappears. Further, with respect to the shifter omission portion 5 caused at the portion where the shifter 4 is overlapped on the sub-shifter 12, it is removed up to the sub-shifter 12, and thereby the phase difference becomes 0°. On the other hand, at the portion where the shifter 4 is overlapped on the sub-shifter 12, a phase difference is 360°. Accordingly, the phase difference at these regions is substantially removed, and thus shading due to the shifter omission portion 5 disappears. As described above, the shifter 4 can be corrected by this method. Nevertheless, this method has such a problem as being complex in its correction process, thereby involving a fear of causing new defects, and it is difficult to accurately perform the positioning of the exposure by spot-exposure in such a complex pattern.

A process using a focused ion beam (hereinafter referred to as FIB) is suitably applied to simplify a correction process and to improve the accuracy of correction. FIGS. 3(a)-3(c) show processes for correcting defects by using an FIB 7. In these processes, the shifter remaining portion 6 is removed by sputter etching by the FIB 7. Further, the shifter omission portion 5 is also removed by sputter etching by the FIB 7; however, in this case, the phase shift of this portion is 0° in this state, and thus there occurs phase-inversion between the phase shift 180° of a shifter portion 4 not processed and the same, thereby producing shading upon exposure.

To cope with this problem, as described, for example, in Japanese Patent Application Laid-open No. 4-449, there is adopted the following correcting method: namely, at the shifter portion 4 of the shifter omission portion 5 removed by the FIB 7, the substrate 1 is deepened by an amount providing a phase shift of 180° to substantially remove a phase difference between the shifter portion 4 and the region where the shifter omission portion 5 is corrected, thus preventing shading from being. Nevertheless, with this method, when the shifter omission portions 5 having indefinite configurations, that is, being different in height from each other are corrected, the substrate 1 is processed according to the irregularity depending on the configuration of the shifter 4 as it is, and thus phase disturbances are sometimes generated at the corrected portions, which makes it difficult to perform perfect correction.

Next, as a method of solving the problem in the processing using the FIB, there is adopted a method of using an FIB assist etching (hereinafter referred to as FIBAE) as described in the copending application and as shown in FIGS. 4(a)–4(c). According to this method, a stopper layer 3 is inserted between the shifter 4 and the chromium pattern 2 to absorb the irregularity of the shifter 4 when using the FIBAE. For example, when a substrate 1 is composed of quartz, a shifter layer 4 is composed of a spin-on-glass (SOG), a gas nozzle 8 supplies a reactive gas 9 used for the FIBAE such as $XeF_2$ (xenon difluoride), and the stopper layer 3 is composed of $Al_2O_3$, $MgF_2$, $CeF_3$ or the like, etching is effected slowly to the shifter layer 4, and thus the processing substantially stops on the stopper layer 3 as shown in FIG. 4(b). Thus, at this step, the irregularity of the shifter 4 is changed to the smaller irregularity in the stopper layer 3 which is thinner than the shifter 4. Thereafter, as, for example, disclosed in Japanese Patent Application Laid-open No. 4-449, the application of the reactive gas 9 is stopped, and the processing is changed to the FIB having little selective etching as shown in FIG. 4(c). Thus the substrate 1 is deepened for eliminating the phase difference between the portion where the shifter omission portion 5 is corrected and the portion having the shifter 4, and therefore, shading produced by the shift omission portion 5 is removed upon exposure. According to this method, since a bottom surface can be flatly processed, the defect correction can be performed with high accuracy in a depth direction regardless of the configurations of defective shifter portions.

Further, by use of the FIB 7 capable of focusing an ion beam to 0.1 micron or less, the accuracy of correction on a flat surface can satisfy the requirement for defect correction. Nevertheless, a problem of this method lies in a resistance to cleaning of the stopper layer 3. In general, as shown in FIG. 5, in manufacturing a phase shift mask, a patterning process is invariably followed by a washing or cleaning process. In the cleaning process, a strong cleaning such as an ozone sulfuric acid cleaning is carried out to perfectly remove the contamination of a mask. For example, $Al_2O_3$, a general coating material, is not resistant to this cleaning, and thus $Al_2O_3$ which is not under a chromium pattern 2 is perfectly dissolved in the cleaning process after the formation of the chromium pattern 2. Therefore, the stopper layer 3 does not exist under the transmitting portion of the shifter 4 to be corrected, and thus the correction to which the above FIBAE process is applied becomes impossible. However, this method can be employed when the stopper layer 3 is selected from materials having such characteristics as transmitting an exposure light, having a large selectivity in the FIBAE process, being resistant to the cleaning, and forming a practically usable film.

SUMMARY OF THE INVENTION

An object of the present invention is to provide an optical mask and a method of correcting the optical mask, wherein the defect correction for a phase shift mask can be performed with high accuracy regardless of the configurations of the defects.

The above object can be achieved, in accordance with the present invention, by providing, under the phase shifter of a phase shift mask capable of inverting the phase of an exposure light, a transparent film different in a resistance to etching in an FIBAE process or mask cleaning process from the phase shifter, thereby absorbing the irregularity of shifter defects with the transparent film when they are corrected. At this time, the resistance to mask cleaning of the transparent film can be achieved in such a manner that it is formed after the formation of a chromium pattern or a plurality of layers of the transparent film are formed.

When shifter defects having indefinite configurations are corrected, since the etching speed to the stopper layer disposed under a shifter is slower than that of the shifter due to the chemical interaction between a reactive gas and a FIB in an FIBAE process, only the irregularity of the shifter etched by physical sputtering is reflected to the stopper layer and thus the irregularity is flattened. Alternatively, when a processing is carried out by a physical sputter etching by using an FIB only, the stopper layer acts as a layer for causing the irregularity of the shifter defects to remain therein. Thus, a stopper layer without a resistance to cleaning is dissolved in a cleaning process to flatten the defective portions. With these actions, the irregularity of the shifter defects can be removed from a mask.

According to the present invention, an etching stopper layer is interposed between a phase shifter and a light intercepting pattern, and a protective film which is resistant to a cleaning process for the mask is disposed on the etching stopper layer. Defective portions of the phase shifter are processed or etched by a focused ion beam and the focused ion beam is utilized together with a reactive gas to select any of the processes for stopping the etching at the etching stopper layer and then to selectively remove the etching stopper layer and a portion of the substrate so as to provide a phase shift equal to or an integral times that of a phase shift provided by the phase shifter. A flat finally processed bottom surface is obtainable even if defects do not have definite configurations by protecting the etching stopper layer from being dissolved in a cleaning step of the mask manufacturing process and causing the etching stopper layer to remain under the phase shifter.

These and other objects, features, and advantages of the present invention will become more apparent from the following description when taken in conjunction with the accompanying drawings which show, for purposes of illustration only, several embodiments of the present invention.

DETAILED DESCRIPTION OF THE PREFERRED EMBODIMENTS

EXAMPLE 1

Figure 1:
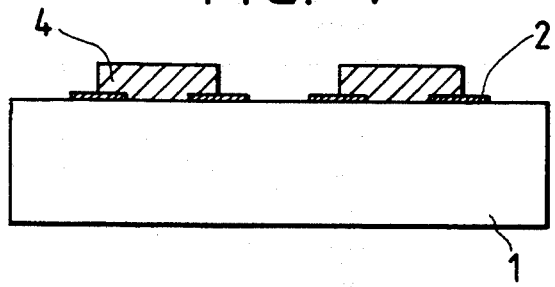
FIG. 1 is a cross-sectional view of a basic phase shift mask.
Figure 2A:
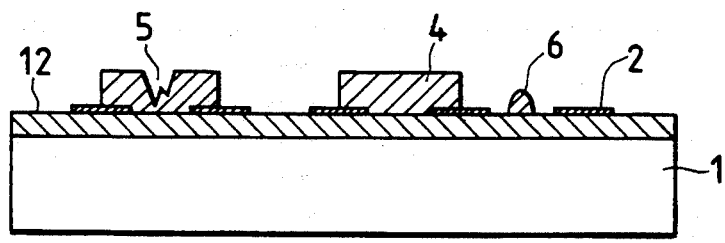
FIGS. 2(a)–2(d) show processing steps for correcting a phase shift defect according to the prior art.
Figure 2B:
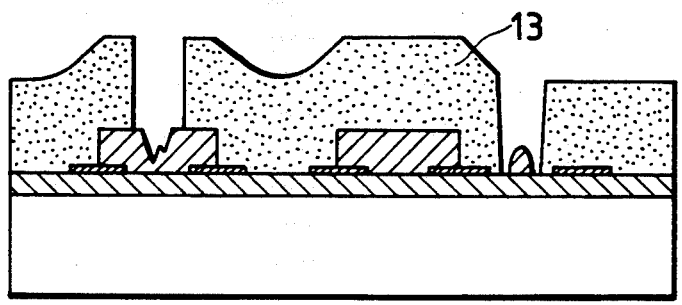
Figure 2C:
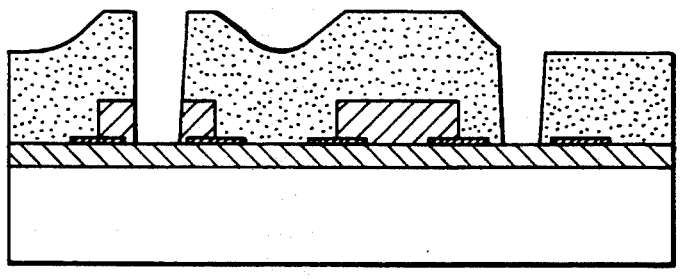
Figure 2D:
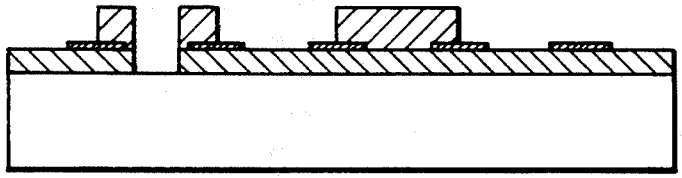
Figure 3A:
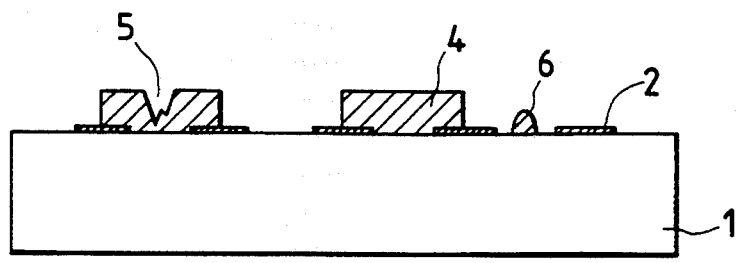
FIGS. 3(a)–3(c) show processing steps using FIB.
Figure 3B:
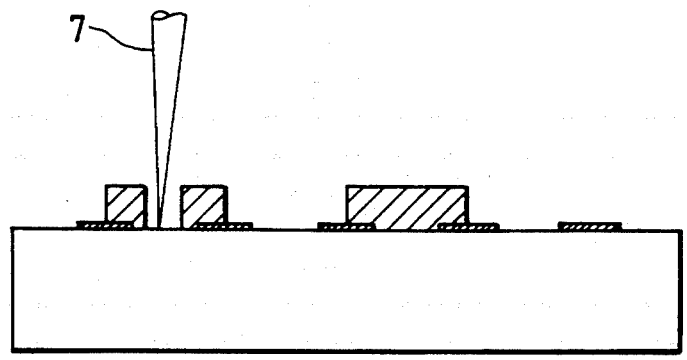
Figure 3C:
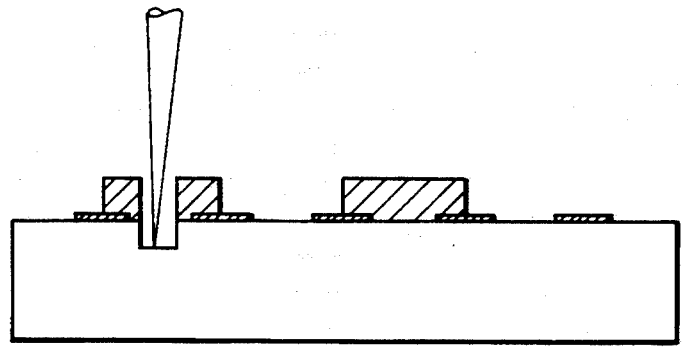
Figure 4A:
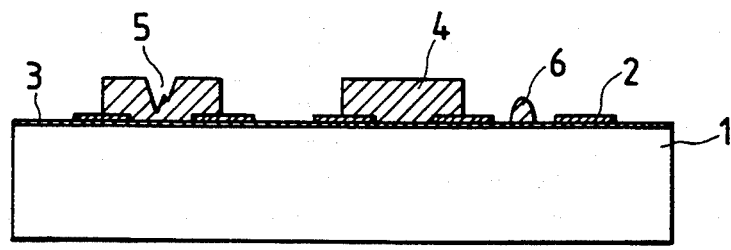
FIGS. 4(a)–4(c) show processing steps using FIBAE.
Figure 4B:
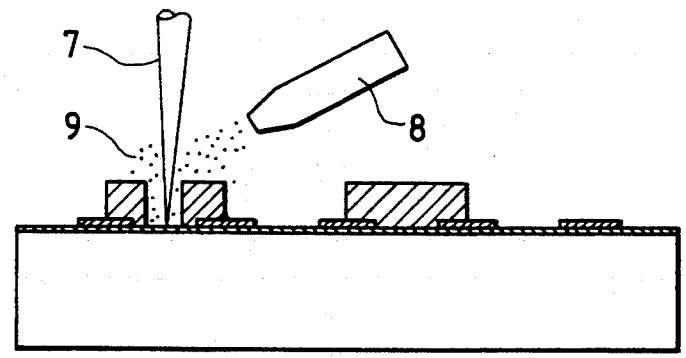
Figure 4C:
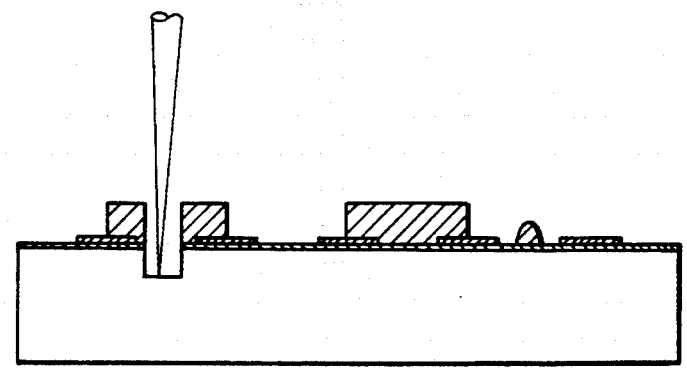

FIGS. 6(a)-6(d) show a mask structure of Example 1 of the present invention and a process for correcting a shifter 4, wherein a substrate 1 is composed of quartz, a light intercepting pattern film 2 is composed of chromium, and the phase shifter 4 is composed of an SOG. A stopper layer 3 is composed of $Al_2O_3$ which is generally used as a coating material for an optical lens. It is confirmed that when $XeF_2$ is used as a reactive gas 9 in an FIBAE process, a ratio of processing speeds, i.e., a processing selection ratio is 40 or higher with respect to $SOG/Al_2O_3$.

Figure 5:
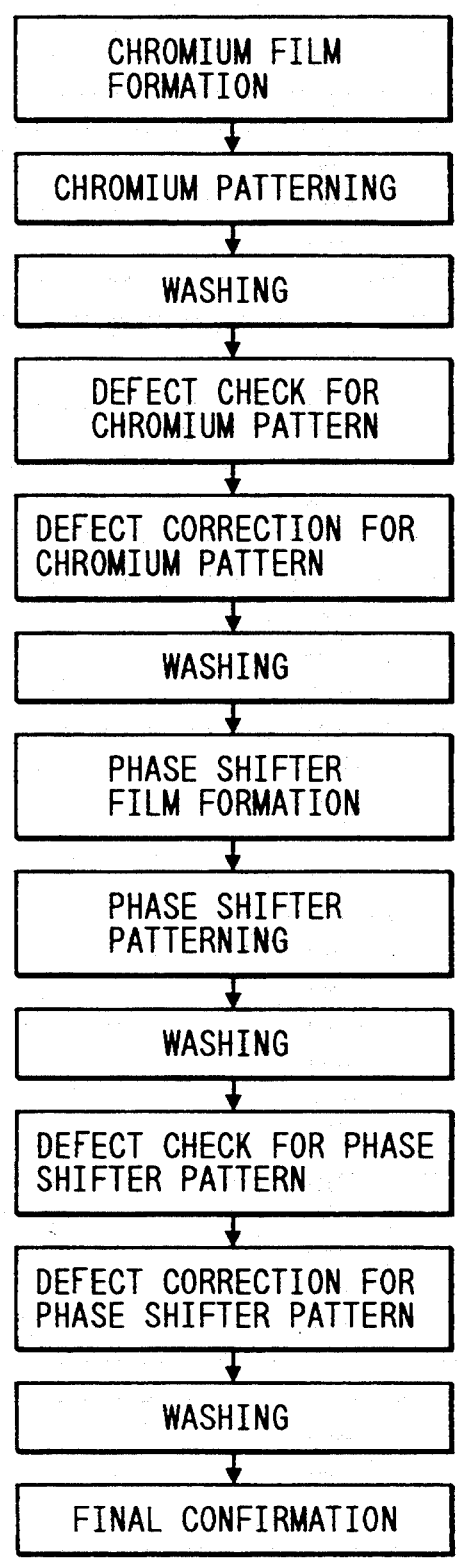
FIG. 5 is a flowchart of processing.

Conventionally, the stopper layer 3 for the FIBAE process is formed under the chromium pattern 2 in a process for making the mask itself. As shown in the flowchart of the manufacturing process of the mask in FIG. 5, a cleaning process is needed after the formation of the chromium pattern 2. In this case, however, the transmitting portion of the stopper layer 3 is exposed to a cleaning solution (e.g., ozone sulfuric acid) before the formation of the SOG film. When the stopper layer 3 is composed of $Al_2O_3$, it is not resistant to ozone sulfuric acid and thus dissolved at this step. In this case, the defects cannot be corrected by the FIBAE process. To cope with this problem, the chromium pattern 2 is formed and washed, the defects thereof are checked and corrected, and a film of $Al_2O_3$ is then formed on the substrate 1 and pattern 2. This is shown as the state of FIG. 6(a).

Figure 6A:
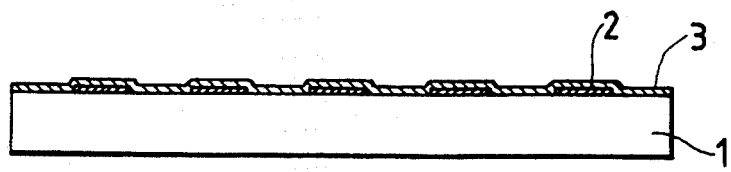
FIGS. 6(a)-6(d) show a phase shifter correction method according to Example 1 of the present invention.
Figure 6B:
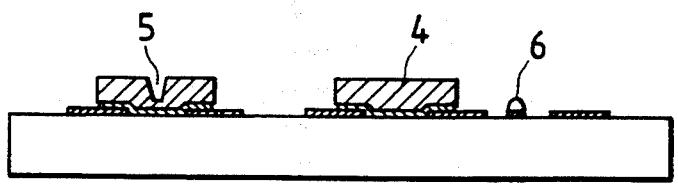
Figure 6C:
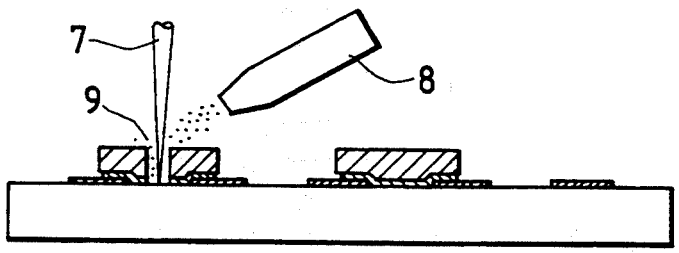

A film of the SOG is formed on the $Al_2O_3$ film and patterned to provide the phase shifter 4. The exposed $Al_2O_3$ film is dissolved by ozone sulfuric acid in the next cleaning process. However, the $Al_2O_3$ film under the shifter 4 remains and becomes the stopper layer 3 because the SOG as the material of the shifter is resistant to the ozone sulfuric acid and acts as a mask. FIG. 6(b) shows the state at this step. When a shifter remaining portion 6 or a shifter omission portion 5 is detected in a defect checking process thereafter, the positional coordinate thereof is supplied to a defect correction device and the next step is a defect correction process as shown in FIG. 6(c). In this example, the FIBAE process is applied as a first step of the defect correction. When an FIB 7 is irradiated while $XeF_2$ acts as a reactive gas 9, since the SOG is processed 40 times faster than the $Al_2O_3$, the $Al_2O_3$ serves as a stopper even with respect to shifter defects having indefinite configurations. The shifter 4 has a film thickness capable of inverting the phase of an exposure light by 180°. When the shifter 4 is composed of the SOG, this film thickness is 415 nm.

Thus, a specification requirement for correcting the phase shifter 4 within 10% of a phase difference of 180° means that the position of a processed bottom surface must be within the range of 40 nm including a degree of flatness in terms of a requirement for the accuracy of a processed depth.

Figure 7:
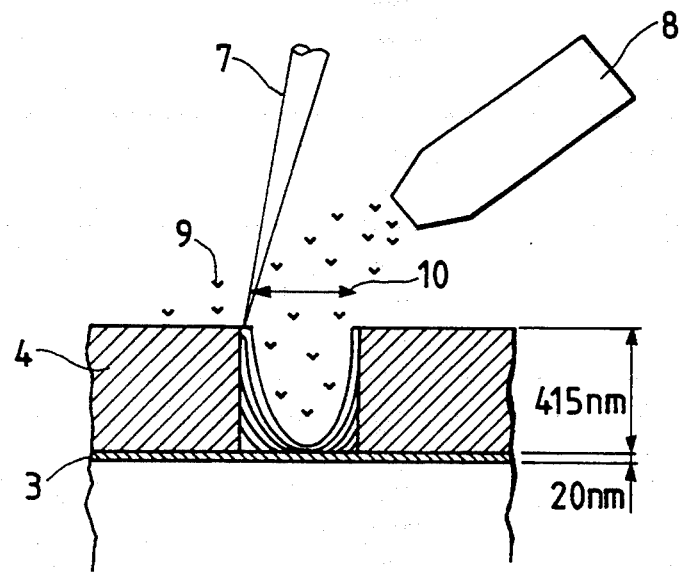
FIG. 7 is a diagram explaining the state of processing performed when a phase shifter is corrected.

In consideration of the actual correction of defects, the maximum height of the shifter defects scarcely exceeds the film thickness 415 nm of the shifter. Further, when the shifter defects are corrected, a processing is carried out in such a manner that the shifter portion having the film thickness of 415 nm around a defective portion 5 is inevitably contained in the region to which the FIB 7 is irradiated in order to make the amounts of phase shifts equal in the region containing the shifter 4. Therefore, the thickness of the stopper layer 3 may be set to prevent an ion irradiation from passing through the stopper layer 3 while a processing is carried out in the ion irradiation region containing both the shifter 4 having the thickness of 415 nm and the portion from which the shifter 4 is almost omitted. More specifically, since the shifter 4 is processed or etched at least 20 times and preferably at 40 times higher speed than that of the stopper layer 3, it is sufficient if the stopper layer 3 is formed with at least a thickness of 20 nm. This is because the portion from which the shifter 4 is almost omitted is deepened into the stopper layer 3 by about 10 nm (to 415 nm/40) at the time when the normal shifter 4 having the thickness of 415 nm is processed up to the stopper layer 3, as shown in FIG. 7. That is, the deepening is stopped at about the middle of the stopper layer 3. Therefore, the irregularity of 415 nm in the shifter is flattened to the irregularity of about 10 nm in the stopper layer 3, which satisfies the specification of the processing of 10% or about ±40 nm.

Figure 6D:
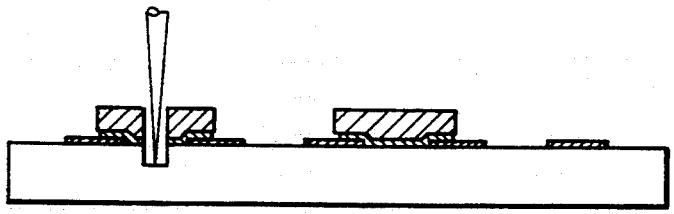

The next correction process is an FIB process shown in FIG. 6(d). The substrate 1 which is composed of quartz, is processed at about 30 times higher speed than $Al_2O_3$ which constitutes the stopper layer 3 when processed by an FIBAE process using $XeF_2$. Therefore, in this process, a reactive gas is not used in order that the irregularity of the processed portion of the substrate is not expanded by the FIBAE process when the FIB 7 passes through the stopper layer 3. At this step, an irregularity slightly remains in the stopper layer. However, as an incident angle is more dislocated from a vertical line, a sputtering ratio representing the number of target atoms removed by an incident ion is more increased. Consequently, any small remaining irregularity is further flattened while the substrate is deepened by a phase difference of 180°, and thus shading can be perfectly removed upon exposure. The shifter omission defect 5 can be corrected by the above method. The shifter remaining defect 6 can be removed by scanning the FIB 7 in accordance with the configuration of the defect in the FIBAE process shown in FIG. 6(c).

EXAMPLE 2

FIGS. 8(a)-8(e) show a structure of a mask of Example 2 and a process for correcting a shifter 4. The mask of this example fundamentally has the same structure as that of Example 1 except only that a stopper layer 3 has a different thickness. Therefore, in this example, the stopper layer 3 rather acts as a layer for absorbing and dissolving the irregularity of defects. A substrate 1 is composed of quartz, a light intercepting layer 2 is composed of chromium, the shifter layer 4 is composed of SOG, and the stopper layer 3 is composed of Al₂O₃, in the same manner as in Example 1. The mask structure of this example is different from that of Example 1 in the thickness of the stopper layer 3.

Figure 8A:
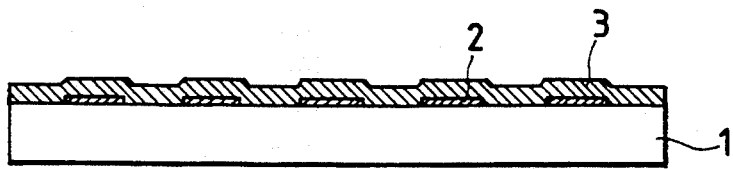
FIGS. 8(a)-8(e) show a phase shifter correction method according to Example 2 of the present invention.
Figure 8B:
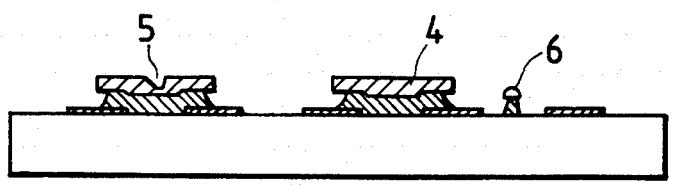

After the formation of the chromium pattern 2, the stopper layer 3 is formed to provide the state shown in FIG. 8(a). The SOG layer is formed thereon and patterned to provide the shifter 4. The film thickness of the SOG layer at this time is set such that the phase of an exposure light is shifted by 180° by the combination of the SOG and the Al₂O₃ under the SOG. Next, a cleaning process is carried out. Since Al₂O₃ is employed for the stopper layer 3, the stopper layer 3 exposed at this step is dissolved, resulting in the state shown in FIG. 8(b). Thereafter, when the defects of the shifter 4 are checked, a shifter omission defect 5 and a shifter remaining defect 6 are detected as shown in FIG. 8(b), and the detected results are supplied to the next defect correction process.

Figure 8C:
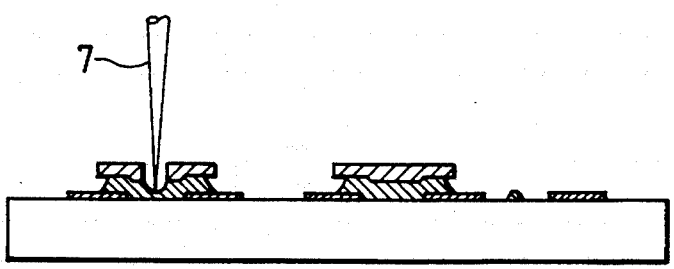
Figure 8D:
Figure 8E:
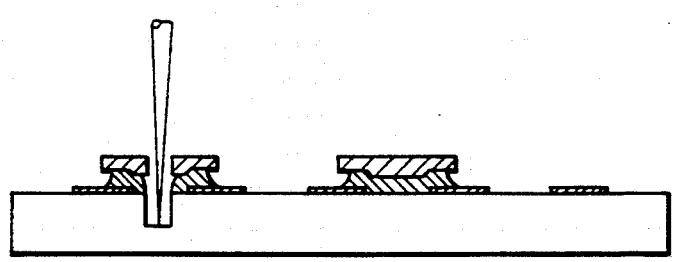

In the defect correction of this example, an FIBAE process is not used and only an FIB processing is used. As shown in FIG. 8(c), when processed only by the FIB 7, the irregularity of the shifter defects is mostly preserved in the stopper layer 3, because there is almost no difference in processing speed between SOG and Al₂O₃ which is different from the case of processing by the FIBAE. In this example, the mask processed up to the stopper layer 3 is washed once at this step to remove the irregularity. Although the stopper layer 3 containing the irregularity of the shifter defects is dissolved by the cleaning as shown in FIG. 8(d), the substrate 1 is not dissolved and thus the portions having the defects are flattened. Although the cleaning process is carried out by wet etching in this example, the same result can be obtained even if the wet etching is replaced with dry etching. Further, the shifter remaining defect portion 6 also is dissolved and perfectly removed from the mask in this process because the shifter portion 4 is removed by the FIB processing in the previous process. Next, the mask is returned to the FIB process again and the quartz substrate 1 where the shifter omission defect 5 exists is deepened by such an amount for shifting the phase of the exposure light by 180° so that the phase thereof is caused to coincide with the phase of the normal shifter portion 4 having the phase shifted by 180° by the combination of the SOG and Al₂O₃ and then the correction is completed. Incidentally, in this example, since only the FIB processing is used in the correcting process, a correction device therefor can be simplified.

EXAMPLE 3

Figure 9A:
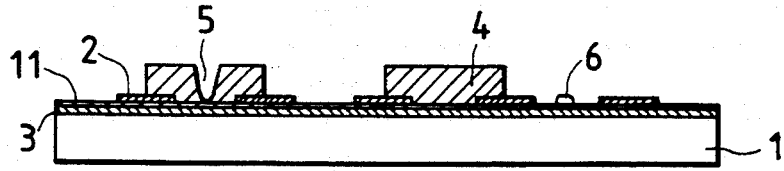
FIGS. 9(a)-9(c) show a phase shifter correction method according to Example 3 of the present invention.
Figure 9B:
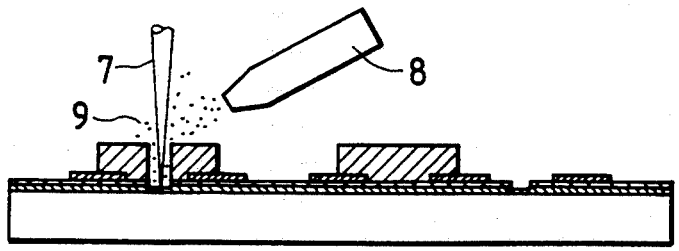
Figure 9C:
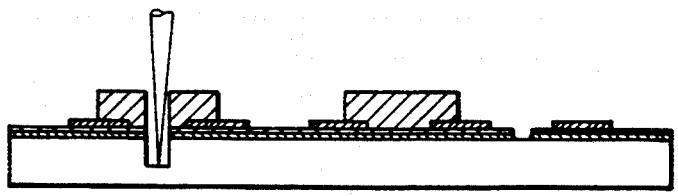

In Examples 1 and 2, the chromium pattern 2 is formed and washed, after which the stopper layer 3 is formed and the shifter layer 4 is masked, so that the stopper layer 3 remains under the shifter 4. In this example, there is adopted a method of forming a protective film 11 resistant to cleaning on the stopper layer 3, as shown in FIGS. 9(a)-9(c).

In this example, first, an Al₂O₃ film is formed as a stopper layer 3 on a quartz substrate 1. Next, an indium/tin oxide (ITO) film is formed as the protective film 11 resistant to cleaning, and then a light intercepting film 2 composed of chromium is formed thereon and patterned. After that, in a cleaning process, since the ITO film on the stopper layer 3 is resistant to the cleaning, it acts as the protective layer 11 and thus the stopper layer 3 is not dissolved by the cleaning. Then, the defects of the chromium pattern 2 are checked and corrected, an SOG film is formed and patterned, and then cleaning is carried out again. At this cleaning step, the stopper layer 3 also is protected by the protective layer 11 and remains without being dissolved. FIG. 9(a) shows this state. When the defects of the mask are checked, a shifter omission defect 5 and a shifter remaining defect 6 are detected. These defects can be corrected in the same manner as Example 1, i.e., the defective portions 5, 6 are processed by an FIBAE process using XeF₂ at a first step as shown in FIG. 9(b). At this time, the protective film 11 under the shifter 4 is processed at the same speed as the shifter 4 but the stopper layer 3 is processed at a speed slower than the shifter 4 as described in Example 1, and thus the irregularity of the shifter defects is flattened by the stopper layer 3. As a second step, the quartz substrate 1 is deepened by an amount providing a phase shifter of 180° by an FIB processing without using a reactive gas 9 so that the phase thereof is caused to coincide with the phase of the normal shifter portion 4 and then the defect correction is completed as shown in FIG. 9(c).

EXAMPLE 4

FIGS. 10(a)-10(d) show a structure of a mask of Example 4 and a process for correcting a shifter 4. In this example, the materials of respective layers are the same as those of Example 3. In this example, however, a stopper layer 3 has a thickness to cause the phase of an exposure light to be shifted by 180°.

Figure 10A:
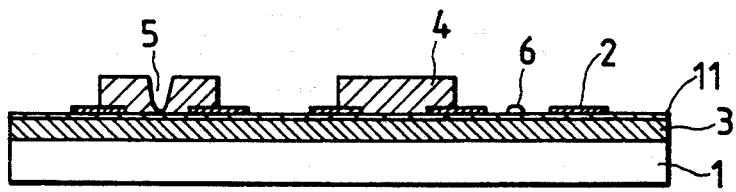
FIGS. 10(a)-10(d) show a phase shifter correction method according to Example 4 of the present invention.

A mask is arranged such that films 3 and 11 composed of Al₂O₃ and ITO, respectively, are formed on a quartz substrate 1 and then a chromium film 2 is formed and patterned. In the same manner as Example 3, the stopper layer 3 is protected by the ITO film 11 and not dissolved in the next cleaning process. Further, an SOG film 4 is formed, patterned and cleaned. At this time, the stopper layer 3 also is not dissolved. The SOG film has a thickness to cause the phase of an exposure light to be shifted by 180°. The defects of the mask are checked and a shifter omission defect 5 and a shifter remaining defect 6 as shown in FIG. 10(a) are to be corrected.

Figure 10B:
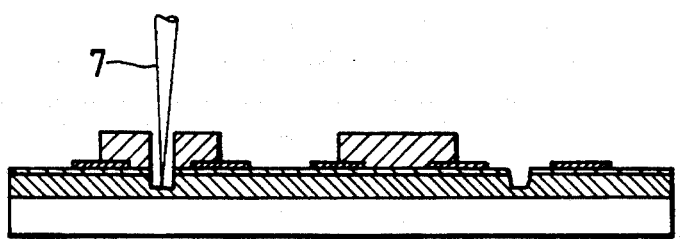
Figure 10C:
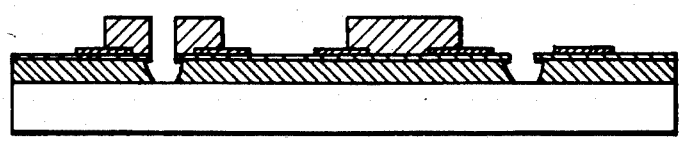
Figure 10D:
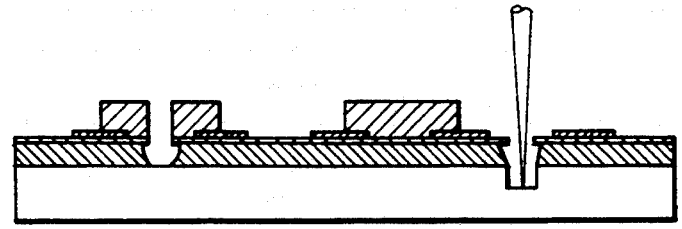

For the correction, only an FIB processing is used in this example. In the FIB processing, all the layers are processed at substantially the same speed. Therefore, the irregularity of the shifter defects is not flattened by the stopper layer 3, although it is flattened when FIBAE is used. Therefore, the irregularity of the shifter defects almost remain in the stopper layer 3 and thus a processed bottom surface is irregular in the FIB processing. FIG. 10(b) shows this state. After this, a cleaning process is carried out to dissolve the stopper layer 3 in which the irregularity remains. As a result, as shown in FIG. 10(c), wet etching advances to and stops on the quartz substrate 1, and thus a flat surface can be obtained. At this step, the phase shift at the normal plane shift portion 4 is 360°, the phase shift at the portion where the shifter omission defect 5 is corrected is 0° the phase shift at the portion where the shifter 4 does not exist is 180° and the phase shift at the portion where the remaining shifter defect 6 is corrected is 0°. Therefore, there is substantially no phase difference at the shifter omission portion 5 and thus the defect is corrected. However, since there is a phase difference of 180° between the normal portion of the shifter remaining portion and the corrected portion thereof, shading is produced at the portion where the phase is changed upon exposure. Thus, to equalize the phase difference between of these portions, the substrate 1 of the portion where the shifter remaining defect 6 is corrected is deepened by the amount of the phase of 180° by using the FIB processing, as shown in FIG. 10(d). With this arrangement, the phase difference also is substantially removed even at this portion, and thus the defect correction is completed. Although the film thickness of the stopper layer 3 provides a phase shift of 180° in this example, when the stopper layer 3 provides a phase shift of 360°, the substrate 1 is not deepened at the shifter remaining defect portion 6, but rather deepened at the shifter omission defect portion 5. With this arrangement, the same result as the aforesaid can be obtained. Further, the stopper layer 3 is dissolved by the cleaning process after the first correction step in this example, but when this process is replaced with a dry etching process, good processing can be performed without producing undercuts and the like of the layer etched by the wet etching. In addition, since only the FIB processing is used in the correction process in this example in the same manner as Example 2, a correction device therefor can be simplified.

Although the stopper layer 3 and protective layer 11 are formed under the light intercepting layer 2 in Examples 3 and 4, the same effect can be obtained even if they are formed on the light intercepting layer 2 in the same manner as Examples 1 and 2.

Although $Al_2O_3$ is employed as the material for the stopper layers 3 of these examples, any material may be employed so long as it provides a sufficient transmittance to an exposure light and is processed at a processing speed slower than that of a shifter material in FIBAE. Metal fluoride materials such as $MgF_2$, $CeF_3$ and the like are included as the candidates for the material in addition to $Al_2O_3$. Further, the function of the protective layer 11 is to provide a sufficient transmittance to the exposure light, not to be dissolved in a cleaning step in a mask manufacturing process, and to have a resistance to etching when the shifter is patterned. Thus, any material satisfying these conditions may be employed in addition to the ITO film employed in the examples described.

According to the present invention, since the shifter defects of a phase shift mask can be repeatedly corrected with high accuracy regardless of the defect configurations, a practically applicable yield of defect correction can be achieved.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

What is claimed is:

1. An optical mask for a projection optical system comprising:
    a light intercepting pattern formed on a transparent substrate;
    a phase shifter for changing the phase of an exposure light, the phase shifter being provided at predetermined openings of the light intercepting pattern; and
    an etching stopper film which transmits the exposure light, the etching stopper film being provided between said phase shifter and said light intercepting pattern.

2. An optical mask according to claim 1, wherein the etching stopper film is substantially resistant to etching of the phase shifter.

3. An optical mask according to claim 1, wherein the etching stopper film enables a substantially smooth surface to be formed at an area thereof subjected to etching.

4. An optical mask according to claim 1, wherein the etching stopper film is formed of one of a metal oxide material and a metal fluoride material.

5. An optical mask according to claim 4, wherein the metal oxide material includes $Al_2O_3$ and the metal fluoride material includes one of $MgF_2$ and $CeF_3$.

6. An optical mask for a projection optical system comprising:
    a light intercepting pattern formed on a transparent substrate;
    a phase shifter for changing the phase of an exposure light, the phase shifter being provided at predetermined openings of the light intercepting pattern;
    an etching stopper layer which transmits the exposure light; and
    a protective film substantially resistant to cleaning in a phase shift mask manufacturing process which transmits the exposure light and which protects the etching stopper layer during the cleaning;
    wherein the protective film is disposed on the etching stopper layer, and wherein the protective film and the etching stopper layer are disposed beneath the phase shifter and one of (1) beneath the light intercepting pattern and (2) on the light intercepting pattern.

7. An optical mask according to claim 6, wherein said etching stopper layer is substantially resistant to etching of the phase shifter.

8. An optical mask according to claim 6, wherein the protective layer and the etching stopper layer are disposed beneath the light intercepting pattern.

9. An optical mask according to claim 6, wherein the protective layer and the etching stopper layer are disposed on the light intercepting pattern.

10. An optical mask according to claim 6, wherein the etching stopper layer is formed of one of a metal oxide material and a metal fluoride material.

11. An optical mask according to claim 10, wherein the metal oxide material includes $Al_2O_3$ and the metal fluoride material includes one of $MgF_2$ and $CeF_3$.

12. An optical mask according to claim 6, wherein the protective layer is a transparent film.

13. An optical mask according to claim 12, wherein the transparent film is an ITO film.

14. An optical mask correcting method for correcting defects of an optical mask for a projection optical system wherein the optical mask includes a light intercepting pattern formed on a transparent substrate, a phase shifter for changing the phase of an exposure light, the phase shifter being provided at predetermined openings of the light intercepting pattern, and a transparent film provided beneath the phase shifter, the method comprising the steps of:
    etching the phase shifter; and
    accurately processing the substrate of the mask to a thickness sufficient to provide a phase shift amount which is one of equal to and an integer times a phase shift amount provided by the phase shifter and to form a substantially smooth surface.

15. An optical mask correcting method according to claim 14, wherein the transparent film is an etching stopper layer substantially resistant to etching of the phase shifter.

16. An optical mask correcting method according to claim 15, wherein a focused ion beam and a reactive gas are utilized together for etching of the phase shifter.

17. An optical mask correcting method according to claim 14, further comprising the step of selective etching of the transparent film.

18. An optical mask correcting method according to claim 17, wherein the step of etching the phase shifter includes partial etching of the transparent film.

19. An optical mask correcting method according to claim 17, wherein a focused ion beam is utilized for etching of the transparent film.

20. An optical mask correcting method for correcting the defects of an optical mask for a projection optical system wherein the optical mask includes a light intercepting pattern formed on a transparent substrate and a phase shifter for changing the phase of an exposure light, the phase shifter being provided at predetermined openings of the light intercepting pattern, the method comprising the steps of:

carrying out etching of the phase shifter up to a transparent film disposed under the phase shifter; and accurately etching the substrate of the mask to a thickness sufficient to provide a phase shift amount which is one of equal to and an integer times a phase shift amount provided by the phase shifter and to form a substantially smooth surface.

21. An optical mask correcting method according to claim 20, further comprising the step of selectively etching the transparent film.

22. An optical mask correcting method according to claim 20, wherein a focused ion beam is utilized for etching of the transparent film.

23. An optical mask correcting method according to claim 20, wherein a focused ion beam and a reactive gas are utilized together for etching of the phase shifter.

24. An optical mask correcting method according to claim 20, further comprising the step of providing a protective layer which is substantially resistant to a cleaning step in an optical mask manufacturing process so as to protect the transparent film during the cleaning step, wherein the protective layer is disposed on the transparent film.

* * * * *